(12) United States Patent
Huang

(10) Patent No.: US 12,525,157 B2
(45) Date of Patent: Jan. 13, 2026

(54) ELECTRONIC DEVICE AND SETTING METHOD FOR ELECTRONIC DEVICE

(71) Applicant: Innolux Corporation, Miaoli County (TW)

(72) Inventor: Zhi-Fu Huang, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 289 days.

(21) Appl. No.: 18/183,968

(22) Filed: Mar. 15, 2023

(65) Prior Publication Data
US 2023/0353139 A1 Nov. 2, 2023

Related U.S. Application Data

(60) Provisional application No. 63/325,149, filed on Mar. 30, 2022.

(30) Foreign Application Priority Data

Dec. 22, 2022 (CN) .......................... 202211656252.0

(51) Int. Cl.
*G09G 3/00* (2006.01)
*H03K 17/14* (2006.01)
*G09G 3/32* (2016.01)

(52) U.S. Cl.
CPC ............. *G09G 3/006* (2013.01); *H03K 17/14* (2013.01); *G09G 3/32* (2013.01); *G09G 2320/04* (2013.01);
(Continued)

(58) Field of Classification Search
CPC ...... G09G 3/32; G09G 3/006; G09G 2320/04; G09G 2320/041; G09G 2330/02; G09G 2330/12; H03K 17/14
See application file for complete search history.

(56) References Cited

U.S. PATENT DOCUMENTS

2008/0106538 A1 5/2008 Ko et al.
2013/0106378 A1* 5/2013 Khlat ...................... H02M 1/15
323/282
(Continued)

FOREIGN PATENT DOCUMENTS

CN 11133632 5/2020

OTHER PUBLICATIONS

"Search Report of Europe Counterpart Application", issued on Aug. 31, 2023, pp. 1-17.

*Primary Examiner* — William Boddie
*Assistant Examiner* — Saifeldin E Elnafia
(74) *Attorney, Agent, or Firm* — JCIPRNET

(57) ABSTRACT

An electronic device, a setting method for determining a common voltage of the electronic device, and a setting method for determining a driving voltage difference range of the electronic device are provided. The electronic device includes a data line, a tunable element, and a control element. The control element stores a threshold voltage of the tunable element. The threshold voltage is a driving voltage difference corresponding to a maximum capacitance value. The control element is configured to provide a first input voltage to the data line and receive a first output voltage. The control element is configured to provide a second input voltage to the data line and receive a second output voltage. The control element determines a desired common voltage according to at least one of the first output voltage and the second output voltage and according to the threshold voltage of the tunable element.

19 Claims, 7 Drawing Sheets

(52) U.S. Cl.
CPC ... *G09G 2320/041* (2013.01); *G09G 2330/02* (2013.01); *G09G 2330/12* (2013.01)

(56) References Cited

U.S. PATENT DOCUMENTS

2021/0407418 A1    12/2021  Yang et al.
2022/0051613 A1*   2/2022  Yu ........................ G09G 3/3233

* cited by examiner

ELECTRONIC DEVICE AND SETTING METHOD FOR ELECTRONIC DEVICE

CROSS-REFERENCE TO RELATED APPLICATION

This application claims the priority benefit of U.S. provisional application Ser. No. 63/325,149, filed on Mar. 30, 2022, and China application serial no. 202211656252.0, filed on Dec. 22, 2022. The entirety of each of the above-mentioned patent applications is hereby incorporated by reference herein and made a part of this specification.

BACKGROUND

Technical Field

The disclosure relates to an electronic device and a setting method for the electronic device; more particularly, the disclosure relates to an electronic device including a tunable element, a setting method for determining a common voltage of the electronic device, and a setting method for determining a driving voltage difference range of the electronic device.

Description of Related Art

An electronic device equipped with a tunable element applies a common voltage and a data voltage to control the tunable element. The tunable element performs operations according to a driving voltage difference range between the common voltage and the data voltage. However, due to differences in manufacturing processes and/or design, unexpected variations may occur in the data voltage, which leads to an unexpected shift of the driving voltage difference range. Therefore, the operations of the tunable element may become abnormal. Accordingly, how to determine the common voltage to provide a desired driving voltage difference range is one of the research focuses of people pertinent in this field.

SUMMARY

The disclosure provides an electronic device, a setting method for determining a common voltage of the electronic device, and a setting method for determining a driving voltage difference range of the electronic device, so as to determine a desired common voltage to provide a desired driving voltage difference range.

An embodiment of the disclosure provides an electronic device that includes a substrate, a data line, a tunable element, and a control element. The data line is disposed on the substrate. The tunable element is disposed on the substrate and electrically connected to the data line. The control element is electrically connected to the data line and configured to store a threshold voltage of the tunable element, where the threshold voltage is a driving voltage difference corresponding to a maximum capacitance value. The control element is configured to provide a first input voltage to the data line and receive a first output voltage, the control element is configured to provide a second input voltage to the data line and receive a second output voltage, and the first input voltage is less than the second input voltage. The control element is configured to determine a desired common voltage according to at least one of the first output voltage and the second output voltage and according to the threshold voltage of the tunable element.

An embodiment of the disclosure provides a setting method for determining a common voltage of an electronic device, and the setting method includes following steps. An electronic device is provided, where the electronic device includes a substrate, a data line, a tunable element, and a control element, the data line and the tunable element are disposed on the substrate, and the tunable element and the control element are electrically connected to the data line, respectively. A threshold voltage of the tunable element is stored in the control element, where the threshold voltage is a driving voltage difference corresponding to a maximum capacitance value. A testing step is performed. The testing steps includes: providing a first input voltage to the data line and receiving a first output voltage output by the data line; providing a second input voltage to the data line and receiving a second output voltage output by the data line, where the first input voltage is less than the second input voltage; determining a desired common voltage according to at least one of the first output voltage and the second output voltage and according to the threshold voltage of the tunable element.

An embodiment of the disclosure provides a setting method for determining a driving voltage difference range of an electronic device, and the setting method includes following steps: (1) providing an electronic device, wherein the electronic device comprises a substrate, a data line, and a tunable element, wherein the data line and the tunable element are disposed on the substrate, and the tunable element is electrically connected to the data line; (2) providing different driving voltage differences to the tunable element to obtain a correlation curve of capacitance values corresponding to the driving voltage differences, wherein the driving voltage differences are voltage differences between a common voltage provided to the tunable element and a data voltage provided to the data line, in the correlation curve, a range within which the capacitance values are increased with an increase in the driving voltage differences comprises a first driving voltage difference range and a second driving voltage difference range which are equal to each other, a first capacitance value variation amount is in the first driving voltage difference range, a second capacitance value variation amount is in the second driving voltage difference range, and the second capacitance value variation amount is greater than the first capacitance value variation amount; and (3) selecting the second driving voltage difference range as a desired driving voltage difference range.

In light of the above, according to one or more embodiments of the disclosure, the control element is able to determine the desired common voltage according to the first and second output voltages output by the data line and the threshold voltage of the tunable element. Since the first and second output voltages are associated with the result of the actual electric properties, the desired common voltage determined herein may be changed in response to variations in the manufacturing process and/or the design. As such, the desired driving voltage difference range may be provided, so as to allow the tunable element to have a relatively large frequency variation range.

In order for the features and advantages of the disclosure to be more comprehensible, the following specific embodiments are described in detail in conjunction with the drawings.

BRIEF DESCRIPTION OF THE DRAWINGS

The accompanying drawings, which are included to provide a further understanding of the disclosure, are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Figure 1:
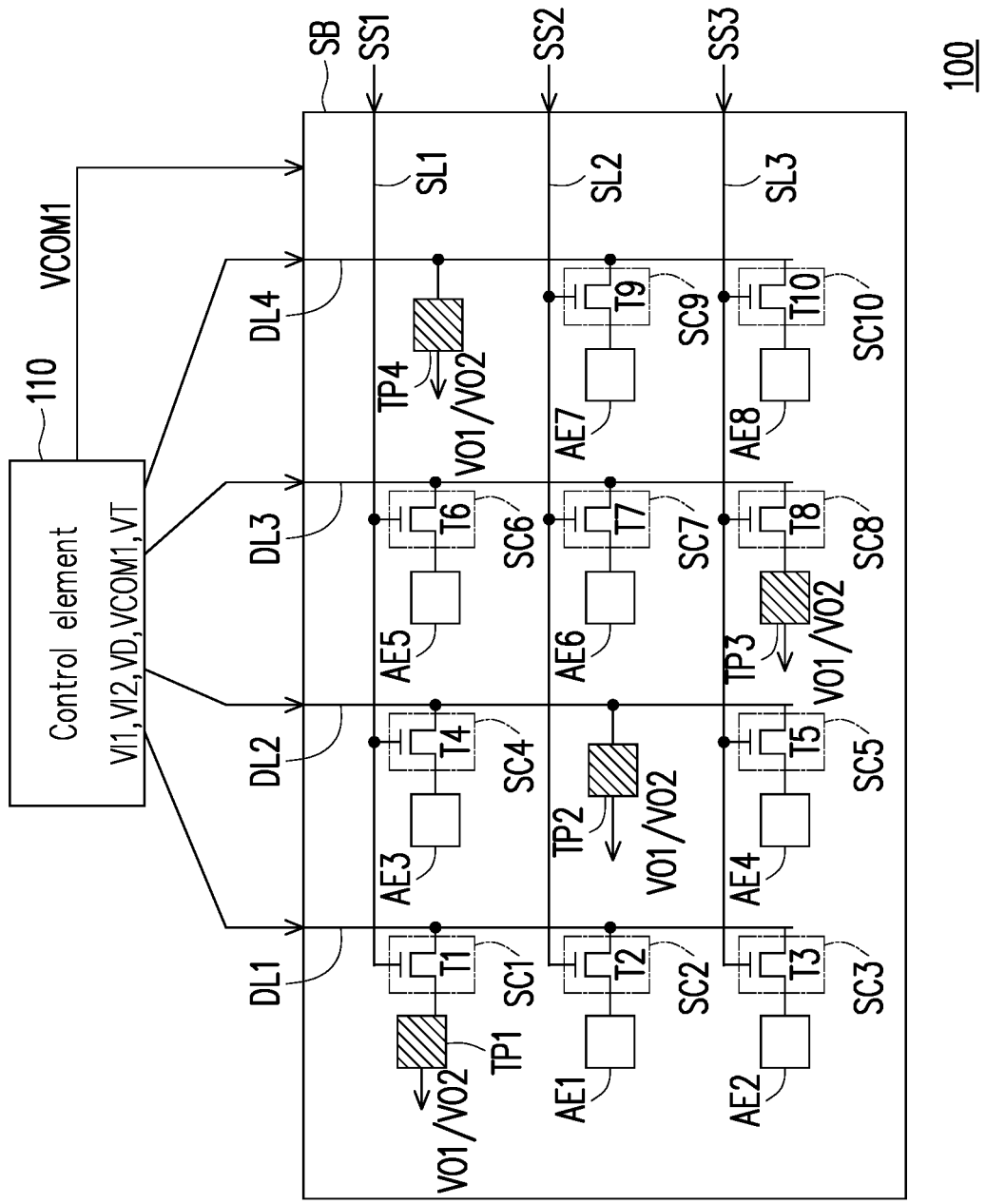
FIG. 1 is a schematic view of an electronic device according to a first embodiment of the disclosure.

The disclosure may be understood with reference to the following detailed description with the drawings. Note that for clarity of description and ease of understanding, the drawings of the disclosure show a part of an electronic device, and certain elements in the drawings may not be drawn to scale. In addition, the number and size of each device shown in the drawings simply serve for exemplifying instead of limiting the scope of the disclosure.

Certain terminologies are used throughout the description and the appended claims to refer to specific elements. As to be understood by those skilled in the art, electronic device manufacturers may refer to an element by different names. Herein, it is not intended to distinguish between elements that have different names instead of different functions. In the following description and claims, terminologies such as "include", "comprise", and "have" are used in an open-ended manner, and thus should be interpreted as "including, but not limited to". Therefore, the terminologies "include", "comprise", and/or "have" used in the description of the disclosure denote the presence of corresponding features, regions, steps, operations, and/or elements but are not limited to the presence of one or more corresponding features, regions, steps, operations, and/or elements.

It should be understood that when one element is referred to as being "coupled to", "connected to", or "conducted to" another element, the one element may be directly connected to the another element with electrical connection established, or intervening elements may also be present in between these elements for electrical interconnection (indirect electrical connection). Comparatively, when one element is referred to as being "directly coupled to", "directly conducted to", or "directly connected to" another element, no intervening elements are present in between.

Although terminologies such as first, second, and third may be used to describe different diverse constituent elements, such constituent elements are not limited by the terminologies. The terminologies are used simply to discriminate one constituent element from other constituent elements in the description. In the claims, the terminologies first, second, third, and so on may be used in accordance with the order of claiming elements instead of using the same terminologies. Accordingly, a first constituent element in the following description may be a second constituent element in the claims.

The electronic device provided in the disclosure may include but is not limited to a display device, an antenna device, a sensing device, a light-emitting device, a touch display, a curved display, or a free-shape display. The electronic device may include a bendable or flexible electronic device. The electronic device may include, for instance, liquid crystal, light emitting diode (LED), quantum dot (QD), fluorescence, phosphor, other suitable display media, or a combination thereof, which should however not be construed as a limitation in the disclosure. The LED may include, for instance, an organic light-emitting diode (OLED), a mini LED, a micro LED, a quantum dot LED (including QLED and QDLED), other suitable materials, or a combination thereof, which should however not be construed as a limitation in the disclosure. The display device may, for instance, include a tiled display device, which should however not be construed as a limitation in the disclosure. The antenna device may, for instance, include a liquid crystal antenna, which should however not be construed as a limitation in the disclosure. The antenna device may, for instance, include a tiled antenna device, which should however not be construed as a limitation in the disclosure. Note that the electronic device may be any arrangement or combination of the above, which should however not be construed as a limitation in the disclosure. In addition, the shape of the electronic device may be a rectangle, a circle, a polygon, a shape with a curved edge, or other suitable shapes. The electronic device may have a peripheral system, for instance, a driving system, a control system, or a light source system, to support the display device, the antenna device, or the tiled device, which should however not be construed as a limitation in the disclosure. The sensing device may include a camera, an infrared sensor, or a fingerprint sensor, and the disclosure is not limited thereto. In some embodiments, the sensing device may also include a flash, an infrared (IF) light source, other sensors, electronic elements, or a combination thereof, which should however not be construed as a limitation in the disclosure.

In one or more embodiments of the disclosure, terminologies such as "pixel" or "pixel unit" are used as a unit for describing a specific region including at least one functional circuit for at least one specific function. The region of a "pixel" depends on the unit for providing a specific function. Adjacent pixels may share the same parts or wires, but may also include their own specific parts therein. For instance, adjacent pixels may share the same scan line or the same data line, but the pixels may also have their own transistors or capacitors.

Note that features in different embodiments described below may be replaced, recombined, or mixed with each other to form another embodiment without departing from the spirit of the disclosure.

Figure 4:
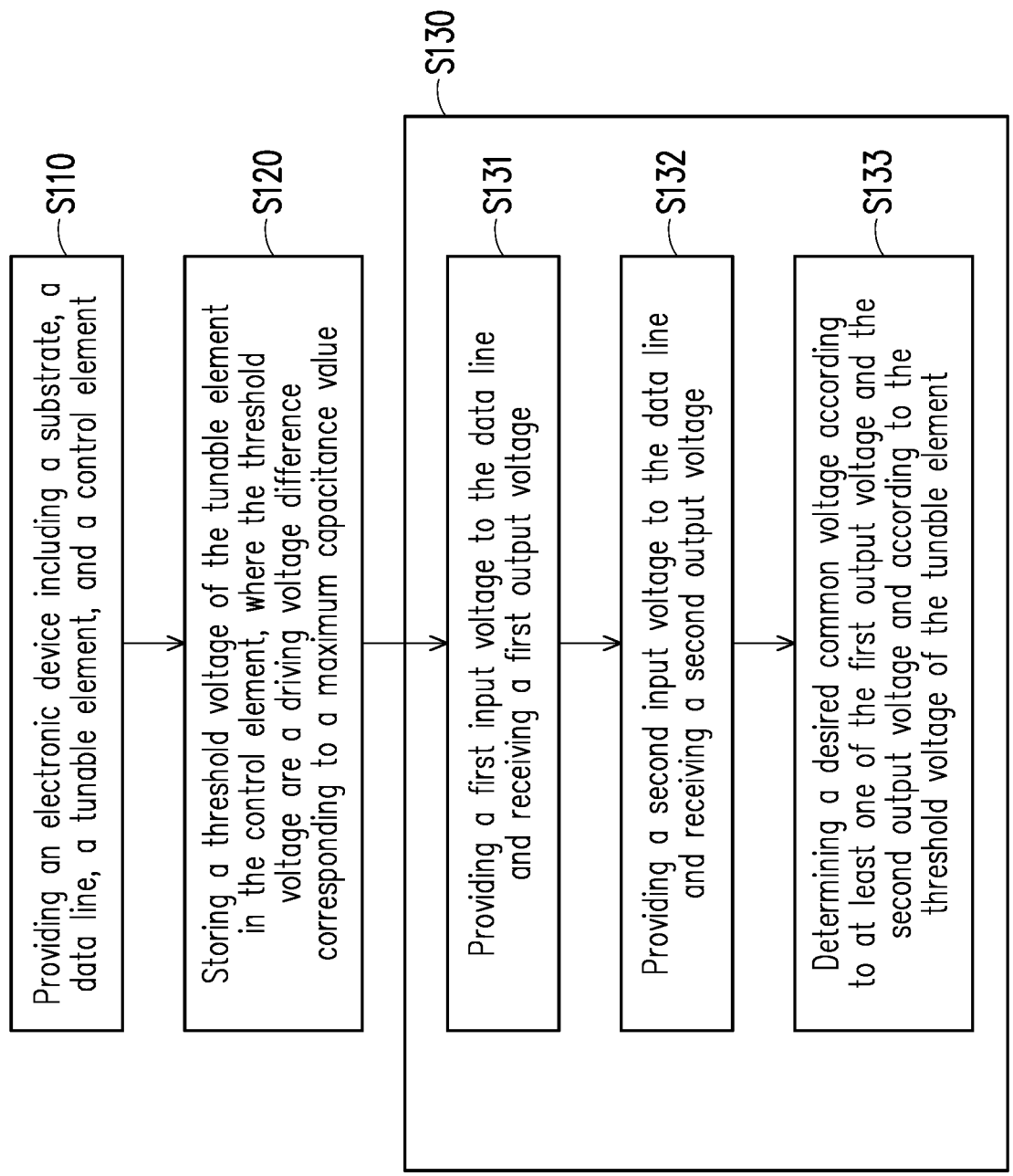
FIG. 4 is a flowchart of a setting method according to the first embodiment of the disclosure.

FIG. 1 is a schematic view of an electronic device according to a first embodiment of the disclosure. FIG. 4 is a flowchart of a setting method according to the first embodiment of the disclosure.

With reference to FIG. 1 and FIG. 4 at the same time, according to this embodiment, in step S110, an electronic device 100 is provided. The electronic device 100 includes a substrate SB, a plurality of data lines DL1-DL4, a control element 110, and a plurality of tunable elements AE1-AE8.

The data lines DL1-DL4 and the tunable elements AE1-AE8 are respectively disposed on the substrate SB. The tunable elements AE1-AE8 are electrically connected to the data lines DL1-DLA, respectively. According to this exemplary embodiment, the tunable elements AE1 and AE2 are electrically connected to the data line DL1. The tunable elements AE3 and AE4 are electrically connected to the data line DL2. The tunable elements AE5 and AE6 are electrically connected to the data line DL3. The tunable elements AE7 and AE8 are electrically connected to the data line DLA. The control element 110 and the data lines DL1-DLA are electrically connected. The number of data lines and the number of tunable elements are only for easy explanation, but are not limited as above.

According to some embodiments, the electronic device 100 is, for instance, adaptable in a wireless transmission field. For instance, the electronic device 100 is, for instance, adapted to an antenna device. The tunable elements may be communication elements, such as varactor diodes, radio frequency radiation elements, or a combination thereof. According to some embodiments, specific parameters of the tunable elements (such as physical parameters) may be adjusted according to the applied signals. The specific parameters may include a capacitance, an inductance, a resistance, a dielectric constant, or a combination thereof, for instance.

In step S120, the control element 110 stores threshold voltages of the tunable elements AE1-AE8. The threshold voltages of the tunable elements AE1-AE8 are driving voltage differences corresponding to a maximum capacitance value. The control element 110 and the data lines DL1-DL4 are electrically connected. To be specific, the control element 110 may provide a data voltage VD to the data lines DL1-DL4. The tunable elements AE1-AE8 may perform operations according to a driving voltage difference between a desired common voltage VCOM1 and the data voltage VD.

According to some embodiments, the tunable elements AE1-AE8 used in the electronic device 100 may be the same tunable element. Therefore, the threshold voltages of the tunable elements may be the same threshold voltage.

In step S130, the electronic device 100 performs a testing step. The testing step includes S131, S132, and S133. In step S131, the control element 110 provides a first input voltage VI1 to the data lines DL1-DL4, so that the electronic device 100 outputs a first output voltage VO1. The control element 110 receives the first output voltage VO1. In step S132, the control element 110 provides a second input voltage VI2 to the data lines DL1-DL4, so that the electronic device 100 outputs a second output voltage VO2. The control element 110 receives the second output voltage VO2. In this embodiment, the first input voltage VI1 is less than the second input voltage VI2.

For instance, the electronic device 100 further includes test pads TP1-TP4 (the electronic device 100 is not limited to include the test pads in the disclosure). The test pads TP1-TP4 are correspondingly electrically connected to the data lines DL1-DL4, respectively, which should not be construed as a limitation in the disclosure. The test pads TP1-TP4 provide the first output voltage VO1 and the second output voltage VO2. respectively. In step S131, when the control element 110 provides the first input voltage VI1 to the data line DL1, the test pad TP1 outputs the first output voltage VO1. When the control element 110 provides the first input voltage VI1 to the data line DL2, the test pad TP2 outputs the first output voltage VO1, and so on.

According to some embodiments, the electronic device 100 may be tested in no need of the test pads TP1-TP4. According to some embodiments, during the testing, the test pads may be disposed in the electronic device 100, so that the test pads TP1-TP4 are electrically connected to the data lines DL1-DL4, respectively, and the test pad may be removed after the testing.

According to some embodiments, without the test pads, the first output voltage VO1 and the second output voltage VO2 may be measured on a circuit element electrically connected to the data line DL1. For instance, as shown in FIG. 1, a circuit element SC1 may be electrically connected to the control element 110 through the data line DL1. The circuit element SC1 is, for instance, a selection circuit, the first output voltage VO1 and the second output voltage VO2 may be measured at one terminal of the selection circuit SC1, and the measurement terminal may be a terminal that is not connected to the data line DL1. According to some embodiments, without the test pads, the first output voltage VO1 and the second output voltage VO2 may be tested directly on the data line DL1.

In addition, for instance, the first output voltage VO1 and the second output voltage VO2 may be provided by the tunable elements AE1-AE8. Steps S131 and S132 may be performed by a measurement tool other than the control element 110 or by a user's manual operations.

In step S133, the control element 110 determines a desired common voltage VCOM1 according to at least one of the first output voltage VO1 and the second output voltage VO2 and according to the threshold voltage of the tunable elements AE1-AE8.

Figure 2:
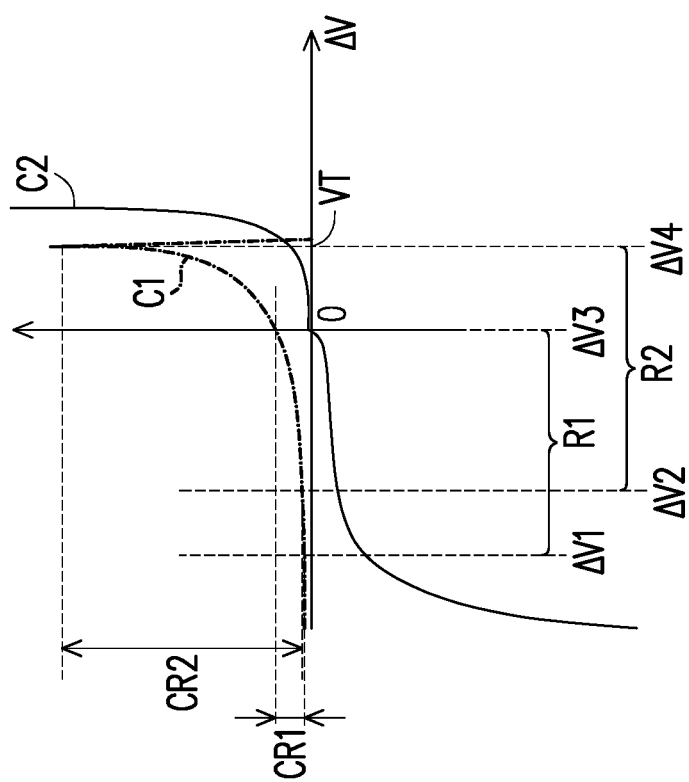
FIG. 2 is a schematic view illustrating an operation of a tunable element according to an embodiment of the disclosure.
Figure 3B:
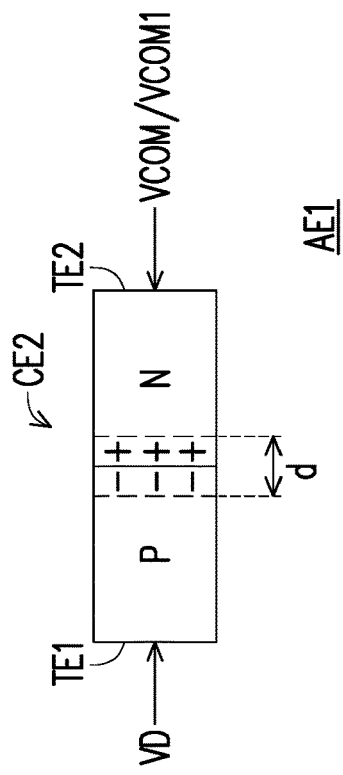
FIG. 3B is a schematic view of a second configuration of a tunable element according to an embodiment of the disclosure.
Figure 3A:
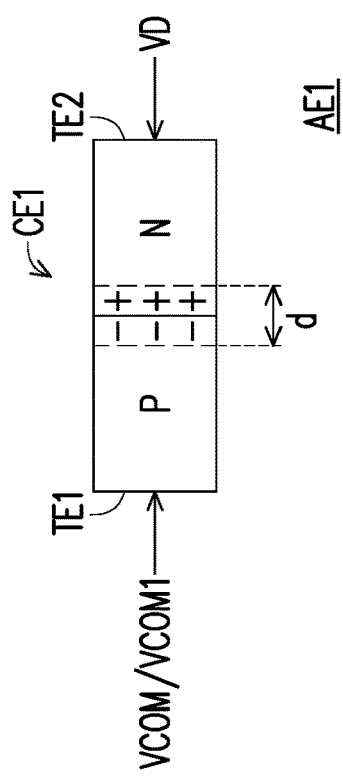
FIG. 3A is a schematic view of a first configuration of a tunable element according to an embodiment of the disclosure.

To further explain the implementation details of the testing step S130, please refer to FIG. 1, FIG. 2, and FIG. 3A at the same time. FIG. 3A is a schematic view of a first configuration of a tunable element according to an embodiment of the disclosure. FIG. 2 shows curves C1 and C2. The curve C1 is a correlation curve showing correlations between a capacitance value and a voltage difference $\Delta V$ for the tunable element AE1. The curve C2 is a correlation curve showing correlations between a current value and the voltage difference $\Delta V$ for the tunable element AE1. The tunable element AE1 may be a PN diode having a first terminal TE1 and a second terminal TE2, the first terminal TE1 may be a positive electrode (a P terminal), and the second terminal TE2 may be a negative electrode (an N terminal).

As shown in FIG. 3A, the first terminal TE1 of the tunable element AE1 is adjacent to a P-type region. The second terminal TE2 of the tunable element AE1 is adjacent to an N-type region. Therefore, the first terminal TE1 may be the positive electrode. The second terminal TE2 may be the negative electrode. When the tunable element is arranged according to a first configuration CE1 shown in FIG. 3A, the positive electrode is connected to the common voltage VCOM, and the negative electrode is connected to the data line to receive the data voltage VD. The voltage difference $\Delta V$ is a difference obtained by subtracting a voltage at the second terminal TE2 of the tunable element AE1 from a voltage at the first terminal TE1 of the tunable element AE1 (i.e., $\Delta V = VCOM - VD$).

When the data voltage VD is greater than the common voltage VCOM, the data voltage VD and the common voltage VCOM generate a reverse bias in the tunable element AE1. That is, the electric voltage difference $\Delta V$ is less than 0. A depletion region between the P-type region and the N-type region has a relatively large width d. As such, the tunable element AE1 enters an off state. In the curve C2, the current value is an extremely small reverse current value. As the data voltage VD decreases, the width d of the depletion region is gradually reduced. Therefore, in the curve C1, the capacitance value increases slowly in response to the decrease in the data voltage VD. When the data voltage VD decreases to be less than the common voltage VCOM (the voltage difference ΔV is greater than 0), the data voltage VD and the common voltage VCOM generate a forward bias in the tunable element AE1. As the data voltage VD continues to decrease, the width d of the depletion region continues to be reduced. In the curve C1 shown in FIG. 2, the capacitance value increases in response to the increase in the data voltage VD. When the voltage difference ΔV reaches a threshold voltage VT, the capacitance value in the curve C1 reaches a peak value. According to the curve C1 of the tunable element AE1, the threshold voltage VT may be obtained. According to a formula (1), when the width d of the depletion region approaches 0, the tunable element AE1 has a maximum capacitance value.

$$C = \varepsilon \frac{A}{d} \qquad \text{Formula (1)}$$

On the condition of the forward bias, that variations in the capacitance value in the curve C1 are relatively considerable. The capacitance value in the curve C1 is associated with an operation bandwidth of the tunable element AE1. That is, the capacitance value of the tunable element AE1 has influence on the resultant operation bandwidth of the tunable element AE1. The greater the fluctuation range of the capacitance value in the curve C1, the greater the operation bandwidth of the tunable element AE1. Therefore, on the condition of the forward bias (the voltage difference ΔV is greater than 0), the tunable element AE1 may have the advantage of providing a relatively large operation bandwidth. However, when the voltage difference ΔV is greater than the threshold voltage VT, the width d of the depletion region is equal to 0. The tunable element AE1 is turned on and generates a forward current. The capacitance value in the curve C1 is reduced to 0.

In this embodiment, in the first configuration CE1 shown in FIG. 3A, the tunable element AE1 is driven in a driving voltage difference range R1 (in a reverse bias range) in case that the common voltage VCOM is not modified. For instance, the common voltage VCOM is 0 volt (V). A voltage difference range R1 may be obtained according to an output voltage of the test pad TP1. For instance, in step S131, the control element 110 provides the first input voltage VI1, so that the test pad TP1 outputs the first output voltage VO1. In step S132, the control element 110 provides the second input voltage VI2, so that the test pad TP1 outputs the second output voltage VO2. The first output voltage VO1 output by the test pad TP1 is, for instance, 0 V. The second output voltage VO2 output by the test pad TP1 is, for instance, 18V. The first output voltage VO1 is substantially equal to an actual minimum voltage received by the tunable element AE1. The second output voltage VO2 is substantially equal to an actual maximum voltage received by the tunable element AE1. A voltage difference ΔV3 is equal to a voltage difference obtained by subtracting the first output voltage VO1 from the common voltage VCOM (i.e., 0V). A voltage difference ΔV1 is equal to a voltage difference obtained by subtracting the second output voltage VO2 from the common voltage VCOM (i.e., −18V). Therefore, in case of not modifying the common voltage VCOM, the driving voltage difference range R1 is between the voltage difference ΔV1 (i.e., −18V) and the voltage difference ΔV3 (i.e., 0 V).

Note that the voltage difference ΔV3 is not close to the threshold voltage VT (e.g., 1V). When the tunable element AE1 is driven in the driving voltage difference range R1, the capacitance value in the curve C1 may simply be tuned in a tunable range CR1. Therefore, when the tunable element AE1 is driven in the driving voltage difference range R1, the operation bandwidth provided by the tunable element AE1 is rather limited.

According to some embodiments, the driving voltage difference range of the tunable element AE1 may be adjusted. The threshold voltage VT of the tunable element AE1 is set as 1V as an example for explanation. In order to shift the curve C1 toward a direction of a relatively high capacitance value, in step S133, the control element 110 may shift the voltage difference ΔV3 to a voltage difference ΔV4 toward the direction of a relatively high capacitance value. The control element 110 may also shift the voltage difference ΔV1 to a voltage difference ΔV2 toward the direction of a relatively high capacitance value.

In step S133, the control element may determine the desired common voltage VCOM1 according to at least one of the first output voltage VO1 and the second output voltage VO2 and according to the threshold voltage VT of the tunable element. Specifically, in order to increase the voltage difference ΔV3 to the voltage difference ΔV4, the common voltage may be adjusted to a higher value. If an upper limit of the voltage difference ΔV is within an optimal range, then all the data voltages VD may be within the optimal range. Therefore, the upper limit ΔV4 of the voltage difference ΔV may be adjusted to the threshold voltage VT. As such, through a calculation, the voltage difference ΔV4=the threshold voltage VT=the desired VCOM1−the first output voltage VO1 (the minimum value of the data voltage VD). Thereby, the desired common voltage is VCOM1 is obtained by adding the first output voltage VO1 to the threshold voltage VT of the tunable element. As a result, according to the above exemplary voltage value, the resultant desired common voltage VCOM1 may be 0+1=1V. When the tunable element is arranged according to the aforesaid first configuration CE1, in step S133, the control element 110 may be add the first output voltage VO1 to the threshold voltage VT of the tunable element to obtain the desired common voltage VCOM1. That is, when the tunable element is arranged according to the aforesaid first configuration CE1, the negative electrode is connected to the data line, and the voltage difference between the desired common voltage VCOM1 and the first output voltage VO1 is the threshold voltage VT of the tunable element.

When the voltage range of the data voltage VD (i.e., 0 V-18 V) remains unchanged and the first terminal TE1 (the positive electrode) of the tunable element AE1 receives the desired common voltage VCOM1 (i.e., 1V), the voltage difference ΔV2 is substantially equal to the voltage difference obtained by subtracting the second output voltage VO2 from the desired common voltage VCOM1. That is, the voltage difference ΔV2 is substantially equal to the voltage difference (i.e., −17V) obtained by subtracting the second output voltage VO2 (i.e., 18V) from the desired common voltage VCOM1 (i.e., 1V). The voltage difference ΔV4 is substantially equal to the voltage difference obtained by subtracting the first output voltage VO1 from the desired common voltage VCOM1; namely, the voltage difference ΔV2 (i.e., 1V) is substantially equal to the voltage difference obtained by subtracting the first output voltage VO2 (i.e., 0V) from the desired common voltage VCOM1 (i.e., 1V). Through the above adjustment, the driving voltage difference range R1 of the tunable element AE1 is adjusted to the driving voltage difference range R2. The driving voltage difference range R2 is between the voltage difference ΔV2 (i.e., −17V) and the voltage difference ΔV4 (i.e., 1V). The driving voltage difference range R2 includes a forward bias range. In addition, the maximum value in the driving voltage difference range R2 is the threshold voltage VT of the tunable element AE1. The threshold voltage VT of the tunable element AE1 is the driving voltage difference corresponding to the maximum capacitance value in the curve C1.

After the above tests and adjustments are performed, the desired common voltage VCOM1 may be obtained, and the adjusted driving voltage difference range R2 may be obtained. According to some embodiments, the adjusted desired common voltage VCOM1 may serve as the common voltage of the tunable element in a normal operation.

For instance, in the normal operation, when the first terminal TE1 (the positive electrode) of the tunable element AE1 receives the desired common voltage VCOM1, as shown in FIG. 2, the capacitance value of the tunable element AE1 may be tuned in a tunable range CR2. The tunable range CR2 of the curve C1 is significantly greater than the tunable range CR1 of the curve C1. Thereby, when the tunable element AE1 is driven in the driving voltage difference range R2, the tunable element AE1 may have the advantage of a relatively large operation bandwidth. In addition, the voltage difference ΔV4 is equal to or close to the threshold voltage VT but is not greater than the threshold voltage VT. Therefore, the tunable element AE1 does not enter an on state.

Please refer to FIG. 1, FIG. 2, and FIG. 3B. FIG. 3B is a schematic view of a second configuration of a tunable element according to an embodiment of the disclosure. In a second configuration CE2, the first terminal TE1 (e.g., the P terminal) receives the data voltage VD. Therefore, the positive electrode of the tunable element AE1 is connected to the corresponding data line to receive the data voltage VD. The second terminal TE2 (e.g., the N terminal) receives the common voltage VCOM. The positive electrode is connected to the data line to receive the data voltage VD, and the negative electrode is connected to the common voltage VCOM. The voltage difference ΔV=the data voltage VD−the common voltage VCOM. The voltage difference ΔV is a difference obtained by subtracting a voltage at the second terminal TE2 of the tunable element AE1 from a voltage at the first terminal TE1 of the tunable element AE1 (i.e., ΔV=VD−VCOM).

For instance, in step S131, the first output voltage VO1 output by the test pad TP1 is, for instance, 0V. In step S132, the second output voltage VO2 output by the test pad TP1 is, for instance, 18V, and the threshold voltage VT of the tunable element AE1 is, for instance, 1V. The common voltage VCOM is, for instance, 18V. The first output voltage VO1 is substantially equal to an actual minimum voltage received by the tunable element AE1. The second output voltage VO2 is substantially equal to an actual maximum voltage received by the tunable element AE1. In other words, the data voltage VD is in a range between the first output voltage VO1 and the second output voltage VO2. The voltage difference ΔV3 is equal to a voltage difference (i.e., 0V) obtained by subtracting the common voltage VCOM (i.e., 18V) from the second output voltage VO2 (i.e., 18V). The voltage difference ΔV1 is equal to a voltage difference (i.e., −18V) obtained by subtracting the common voltage VCOM (i.e., 18V) from the first output voltage VO2 (i.e., 0V) Therefore, the driving voltage difference range R1 is between the voltage difference ΔV1 (i.e., −18V) and the voltage difference ΔV3 (i.e., 0V).

Similar to the above-mentioned first configuration CE1, according to some embodiments, the driving voltage difference range of the tunable element AE1 in the second configuration CE2 may be adjusted. In order to shift the curve C1 in FIG. 2 toward a direction of a relatively high capacitance value, the voltage difference ΔV3 may be shifted to the voltage difference ΔV4 toward the direction of a relatively high capacitance value, and the driving voltage difference range R1 of the tunable element AE1 is adjusted to the voltage difference range R2.

In step S133, the control element may determine the desired common voltage VCOM1 according to at least one of the first output voltage VO1 and the second output voltage VO2 and according to the threshold voltage VT of the tunable element. In order to shift the curve C1 toward the direction of a relatively high capacitance value, in step S133, the control element 110 may shift the voltage difference ΔV3 to the voltage difference ΔV4 toward the direction of a relatively high capacitance value. The control element 110 may also shift the voltage difference ΔV1 to the voltage difference ΔV2 toward the direction of a relatively high capacitance value.

Specifically, in order to increase the voltage difference ΔV3 to the voltage difference ΔV4, the common voltage may be adjusted to a higher value. If an upper limit of the voltage difference ΔV is within an optimal range, then all the data voltages VD may be within the optimal range. Therefore, the upper limit ΔV4 of the voltage difference ΔV may be adjusted to the threshold voltage VT. As such, through a calculation, the voltage difference ΔV4=the threshold voltage VT=the second output voltage VO2 (the maximum value of the data voltage VD)−the desired common voltage VCOM1. Thereby, the desired common voltage is VCOM1 is obtained by subtracting the threshold voltage VT of the tunable element from the second output voltage VO2. As a result, according to the above exemplary voltage value, the resultant desired common voltage VCOM1 may be 18−1=17V. When the tunable element is arranged according to the aforesaid second configuration CE2, in step S133, the control element 110 may be subtract the threshold voltage VT of the tunable element from the second output voltage VO2 to another obtain the desired common voltage VCOM1. That is, when the tunable element is arranged according to the aforesaid second configuration CE2, the positive electrode is connected to the data line, and the voltage difference between the desired common voltage VCOM1 and the second output voltage VO2 is the threshold voltage VT of the tunable element.

When the voltage range of the data voltage VD (i.e., 0 V–18 V) remains unchanged and the first terminal TE1 of the tunable element AE1 receives the data voltage VD, the voltage difference ΔV2 is substantially equal to the voltage difference obtained by subtracting the desired common voltage VCOM1 (i.e., −17V) from the first output voltage VO1. The voltage difference ΔV4 is substantially equal to the voltage difference obtained by subtracting the desired common voltage VCOM1 (i.e., −17V) from the second output voltage VO2. That is, the driving voltage difference range R2 is between the voltage difference ΔV2 (i.e., −17V) and the voltage difference ΔV4 (i.e., 1V).

According to some embodiments, the desired common voltage VCOM1 is determined according to at least one of the first output voltage VO1 and the second output voltage VO2 output by the test pads TP1-TP4. Since the first output voltage VO1 and the second output voltage VO2 are associated with the actual resultant electric properties, the desired common voltage VCOM1 determined in this embodiment may be changed in response to differences in manufacturing processes and/or design. As such, the desired driving voltage difference range may be provided, and a frequency variation range of the tunable element may be expanded.

With reference to the embodiments illustrated in FIG. 1 and FIG. 4, according to this embodiment, the first input voltage VI1 may correspond to a minimum driving voltage of the electronic device 100, and the second input voltage VI2 may correspond to a maximum driving voltage of the electronic device 100. For instance, the driving voltage is the data voltage. Therefore, the minimum driving voltage may be the minimum value of the data voltage VD. The maximum driving voltage may be the maximum value of the data voltage VD. According to some embodiments, the first input voltage VI1 may correspond to a minimum gray scale of the electronic device 100, and the second input voltage VI2 may correspond to a maximum gray scale of the electronic device 100.

In some embodiments, step S130 may be performed by a measurement tool other than the control element 110 or by a user's manual operations, which should not be construed as a limitation in the disclosure.

In some embodiments, the control element 110 or the measurement tool may determine the desired common voltage VCOM1 according to an average value of the first output voltages VO1 output by the test pads TP1 and TP3. The control element 110 or the measurement tool may determine the desired common voltage VCOM1 according to an average value of the second output voltages VO2 output by the test pads TP1 and TP3. The position where the test pads are disposed is not construed as a limitation in the disclosure. According to some embodiments, in order to obtain a uniform desired common voltage VCOM1, five test pads that are evenly distributed may be disposed on the substrate. For instance, the five test pads may be disposed at four corner positions of the substrate and a central position of the substrate, respectively, which should not be construed as a limitation in the disclosure.

According to some embodiments, in case of not using the test pads, measurements may be performed on several positions evenly distributed on the substrate to obtain a uniform desired common voltage VCOM1. The first output voltages at different positions are measured, and the average value of the first output voltages is obtained. Similarly, the second output voltages at different positions are measured, and the average value of the second output voltages is obtained. The positions where the measurements are performed may be the four corner positions of the substrate and the central position of the substrate, which should not be construed as a limitation in the disclosure.

In this embodiment, when the desired common voltage VCOM1 is determined in the manner described above, the desired common voltage VCOM1 may be further fine-tuned to obtain a fine-tuned desired common voltage. The voltage difference between the first input voltage VI1 and the desired common voltage VCOM1 generate a forward bias in the tunable elements AE1-AE8. The measurement tool may be applied to gradually increase the desired common voltage VCOM1 and detect response frequencies of the tunable elements AE1-AE8. For instance, the desired common voltage VCOM1 may be gradually increased by 0.1V from 1V, so that the capacitance values of the tunable elements AE1-AE8 may be increased correspondingly. Therefore, the response frequencies of the tunable elements AE1-AE8 are reduced. For instance, when the desired common voltage VCOM1 is increased from 1.2V to 1.3V, the response frequencies of the tunable elements AE1-AE8 disappear. This means that when the desired common voltage VCOM1 reaches 1.3V, the tunable elements AE1-AE8 are turned on. Therefore, 1.2V may serve as an acceptable maximum desired common voltage VCOM1; that is, the fine-tuned desired common voltage VCOM1 is 1.2V.

In this embodiment, the first output voltage VO1 and the second output voltage VO2 output by the test pads TP1-TP4 may be measured by a measurement tool (not shown). The measurement tool may contact a metal contact surface of the test pads TP1-TP4 through a prober or a pin, thereby obtaining the first output voltage VO1 and the second output voltage VO2. The measurement tool determines the desired common voltage VCOM1 according to one of the first output voltage VO1 and the second output voltage VO2 and provides the desired common voltage VCOM1 to the control element 110. Therefore, the control element 110 provides the desired common voltage VCOM1 to the tunable elements AE1-AE8. The control element 110 provides the desired common voltage VCOM1 to at least one common electrode of the tunable elements AE1-AE8, for instance. The desired common voltage VCOM1 may be determined in a testing period other than a period of a normal operation. During the testing period, the control element 110 provides the first input voltage VI1 and the second input voltage VI2 to the data lines DL1-DL4. During the period of the normal operation, the control element 110 provides the data voltage VD to the data lines DL1-DL4.

In some embodiments, the measurement tools may contact the metal contact surface of the test pads TP1-TP4 through a prober or a pin to obtain the first output voltage VO1 and the second output voltage VO2. The measurement tool may transmit the first output voltage VO1 and the second output voltage VO2 to the control element 110. Therefore, the control element 110 determines the desired common voltage VCOM1 according to one of the first output voltage VO1 and the second output voltage VO2 and provides the desired common voltage VCOM1 to the tunable elements AE1-AE8. In some embodiments, the control element 110 obtains the first output voltage VO1 and the second output voltage VO2 through the metal contact surface of the test pads TP1-TP4.

In this embodiment, the electronic device 100 may be an antenna device. The tunable elements AE1-AE8 may be varactor diodes. In some embodiments, the electronic device 100 may be a display apparatus. The tunable elements AE1-AE8 may be pixel circuits.

In this embodiment, the electronic device 100 further includes scan lines SL1-SL3 and selection circuits SC1-SC10. The scan lines SL1-SL3 respectively receive one of scan signals SS1-SS3. The test pad TP1 is connected to the scan line SL1 and the data line DL1 by the selection circuit SC1. The test pad TP3 is connected to the scan line SL3 and the data line DL3 by the selection circuit SC8. The tunable elements AE1-AE8 are connected to the corresponding scan line and data line through the corresponding selection circuit.

Note that the test pads TP1 and TP3 are connected to the corresponding scan lines and data lines by the selection circuits SC1 and SC8. The configuration of the test pads TP1 and TP3 is similar to the configuration of the tunable elements AE1-AE8. Therefore, the first output voltage VO1 and the second output voltage VO2 provided by the test pads TP1 and TP3 correspond to the actual resultant electric properties of the tunable elements AE1-AE8.

In addition, in this embodiment, the test pads TP2 and TP4 are directly connected to the corresponding data lines. Therefore, the first output voltage VO1 and the second output voltage VO2 provided by the test pads TP2 and TP4 correspond to load characteristics of the data lines, such as resistance, capacitance, and so on.

Each of the selection circuits SC1-SC10 includes a selection transistor. In this embodiment, the selection circuit SC1 includes a selection transistor T1. The selection circuit SC2 includes a selection transistor T2. It may be deduced from the above that the selection circuit SC10 includes a selection transistor T10. A first terminal of the exemplary selection transistor T1 is connected to the data line DL1. A second terminal of the selection transistor T1 is connected to the test pad TP1. A control terminal of the selection transistor T1 is connected to the scan line SL1. A first terminal of the exemplary selection transistor T2 is connected to the data line DL1. A second terminal of the selection transistor T2 is connected to the tunable element AE1. A control terminal of the selection transistor T2 is connected to the scan line SL2.

In this embodiment, when the selection transistor T1 receives the scan signal SS1 through the scan line SL1, the selection transistor T1 is turned on. Therefore, the test pad TP1 receives a voltage at the data line DL1 (e.g., one of the first input voltage VI1 and the second input voltage VI2) during the testing period. when the selection transistor T2 receives the scan signal SS2 through the scan line SL2, the selection transistor T2 is turned on. Therefore, the tunable element AE1 receives a voltage at the data line DL1 (e.g., the data voltage) during the period of the normal operation.

In this embodiment, the substrate SB may be a rigid substrate or a flexible substrate. For instance, the rigid substrate may be a glass substrate, and the flexible substrate may be a plastic substrate or a polymer substrate, which should not be construed as a limitation in the disclosure. A material of the rigid substrate may include glass, quartz, sapphire, ceramics, other appropriate materials, or a combination thereof. A material of the flexible substrate may include polyimide (PI), polycarbonate (PC), polyethylene terephthalate (PET), other appropriate materials, or a combination thereof.

In this embodiment, after the desired common voltage VCOM1 is determined, the control element 110 provides the desired common voltage VCOM1 to the tunable elements AE1-AE8. In addition, the control element 110 provides the data voltage VD to the data lines DL1-DLA. The data voltage VD is within a range from the first output voltage VO1 to the second output voltage VO2.

For explanatory purposes, four data lines DL1-DL4, eight tunable elements AE1-AE8, four test pads TP1-TP4, and three scan lines SL1-SL3 are taken as an example in this embodiment. However, the number of the data lines, the number of the tunable elements, the number of the test pads, and the number of the scan lines should not be construed as limitations in the disclosure. Each of the number of the data lines, the number of the tunable elements, the number of the test pads, and the number of the scan lines may be one or plural.

Based on the above, according to some embodiments, the control element may determine the desired common voltage according to the first output voltage and the second output voltage output by the data line and the threshold voltage of the tunable element. Since the first output voltage and the second output voltage are associated with the actual resultant electric properties, the desired common voltage determined according to one or more embodiments of the disclosure may be changed in response to variations in the manufacturing process and/or the design. As such, the desired driving voltage difference range may be provided, so as to allow the tunable elements to have a relatively large frequency variation range.

Figure 5:
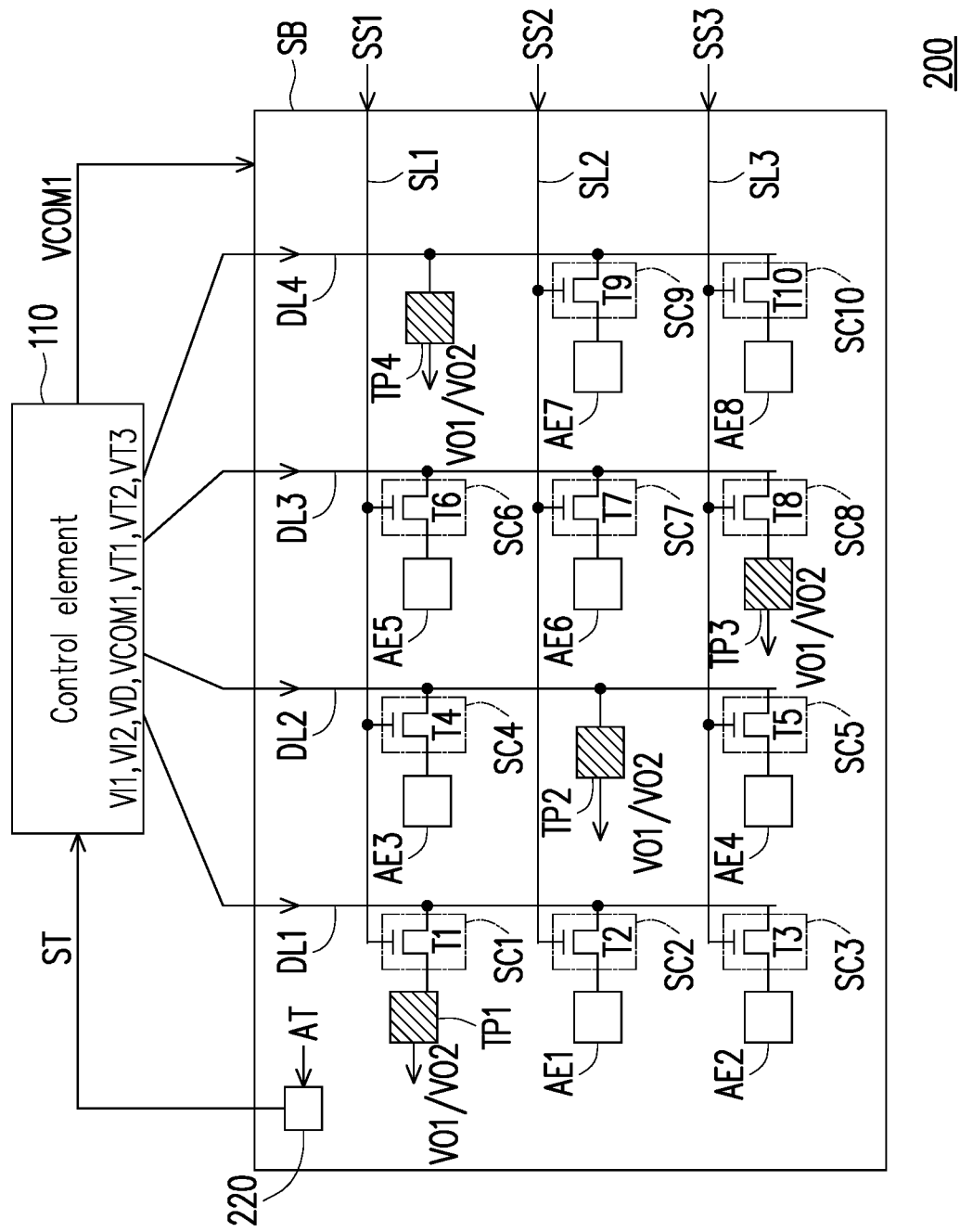
FIG. 5 is a schematic view of an electronic device according to a second embodiment of the disclosure.
Figure 6:
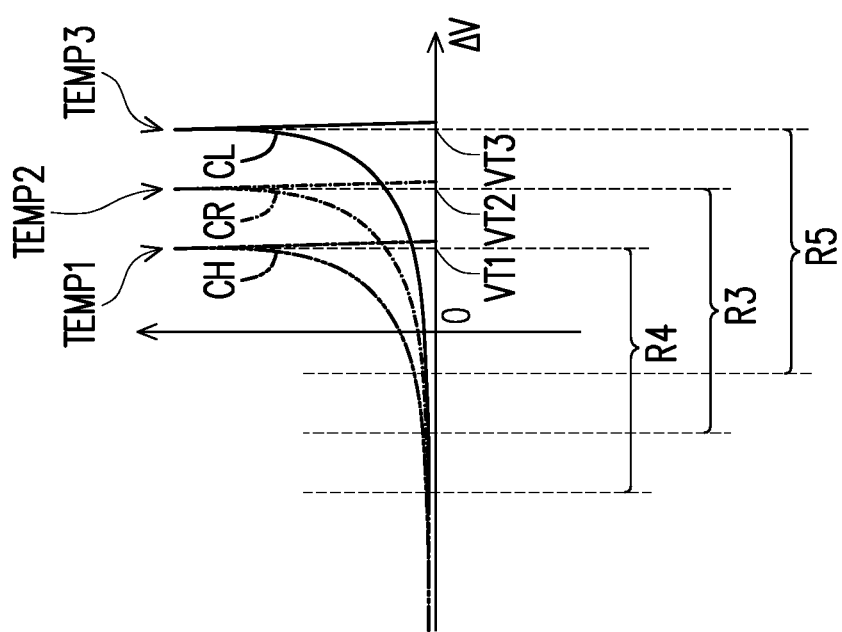
FIG. 6 is a schematic view illustrating variations of capacitance values of a tunable element together with time according to a second embodiment of the disclosure.

Please refer to FIG. 5 and FIG. 6 at the same time. FIG. 5 is a schematic view of an electronic device according to a second embodiment of the disclosure. FIG. 6 is a schematic view illustrating variations of capacitance values of a tunable element together with time according to a second embodiment of the disclosure. FIG. 6 shows a simple architecture of the tunable element and curves CR, CH, and CL at different ambient temperatures AT. The curve CH is a correlation curve showing correlations between the capacitance value of the tunable element AE1 and the voltage difference ΔV when the ambient temperature AT is a first temperature TEMP1, the curve CR is a correlation curve showing correlations between the capacitance value of the tunable element AE1 and the voltage difference ΔV when the ambient temperature AT is a second temperature TEMP2, and the curve CL is a correlation curve showing correlations between the capacitance value of the tunable element AE1 and the voltage difference ΔV when the ambient temperature AT is a third temperature TEMP3. The first temperature TEMP1 is greater than the second temperature TEMP2, and the second temperature TEMP2 is greater than the third temperature TEMP3.

According to some embodiments, the temperature TEMP2 is, for instance, the room temperature, and the room temperature is, for instance, 25 degrees Celsius, which should not be construed as a limitation in the disclosure. The first temperature TEMP1 is a temperature higher than the room temperature, and the third temperature TEMP3 is a temperature lower than the room temperature. When the ambient temperature AT is the room temperature (the second temperature TEMP2), the threshold voltage of the tunable element is VT2. When the ambient temperature AT is higher (the first temperature TEMP1), the tunable element has a lower threshold voltage VT1, and when the ambient temperature AT is lower (the third temperature TEMP3), the tunable element has a higher threshold voltage VT3. That is, the threshold voltage VT1<the threshold voltage VT2<the threshold voltage VT3.

In this embodiment, an electronic device 200 includes the substrate SB, the data lines DL1-DL4, the control element 110, the tunable elements AE1-AE8, the test pads TP1-TP4, the scan lines SL1-SL3, the selection circuits SC1-SC10, and a temperature detector 220. Implementation details of the substrate SB, the data lines DL1-DL4, the control element 110, the tunable elements AE1-AE8, the test pads TP1-TP4, the scan lines SL1-SL3, and the selection circuits SC1-SC10 are already explained in the embodiments illustrated in FIG. 1 and FIG. 2 and thus will not be further described hereinafter, it is therefore not repeated here.

For instance, as shown in FIG. 6, the tunable elements AE1-AE8 have the threshold voltage VT1 at the first temperature TEMP1. The tunable elements AE1-AE8 have the threshold voltage VT2 at the second temperature TEMP2. The first temperature TEMP1 is different from the second temperature TEMP2.

As shown in FIG. 6, when the ambient temperature AT is the first temperature TEMP1, the control element 110 may, based on the measurements and adjustments similar to those provided above, determine the desired common voltage VCOM1 according to at least one of the first output voltage VO1 and the second output voltage VO2 received at the first temperature TEMP1 and according to the threshold voltage VT1 of the tunable elements AE1-AE8. At the first temperature TEMP1, the adjusted desired common voltage VCOM1 may serve as the common voltage of the tunable element in the normal operation. The driving voltage difference range is R4, and the upper limit of the driving voltage difference range R4 is equal to the threshold voltage VT1. The electronic device may operate in the driving voltage difference range R4.

When the ambient temperature AT is the second temperature TEMP2, the control element 110 determines the desired common voltage VCOM1 according to at least one of the first output voltage VO1 and the second output voltage VO2 received at the second temperature TEMP2 and according to the threshold voltage VT2 of the tunable elements AE1-AE8. At the second temperature TEMP2, the adjusted desired common voltage VCOM1 may serve as the common voltage of the tunable element in the normal operation. The driving voltage difference range is R3, and the upper limit of the driving voltage difference range R3 is equal to the threshold voltage VT2. The electronic device may operate in the driving voltage difference range R3.

In addition, when the ambient temperature AT is the third temperature TEMP3, the control element 110 determines the desired common voltage VCOM1 according to at least one of the first output voltage VO1 and the second output voltage VO2 received at the third temperature TEMP3 and according to the threshold voltage VT3 of the tunable elements AE1-AE8. At the third temperature TEMP3, the adjusted desired common voltage VCOM1 may serve as the common voltage of the tunable element in the normal operation. The driving voltage difference range is R5, and the upper limit of the driving voltage difference range R5 is equal to the threshold voltage VT3. The electronic device may operate in the driving voltage difference range R5.

As mentioned above, at different ambient temperatures AT, the tunable elements have different threshold voltages, whereby different desired common voltages suitable for different temperatures may be obtained, respectively. Therefore, the tunable element AE1 may still provide a relatively large operation bandwidth at different temperatures.

In this embodiment, the temperature detector 220 detects the ambient temperature AT. The control element 110 determines the adjusted common voltage VCOM1 according to the ambient temperature AT. In particular, the temperature detector 220 detects the ambient temperature AT to provide a temperature signal ST corresponding to the ambient temperature AT. The control element 110 receive the temperature signal ST. In this embodiment, the control element 110 stores the threshold voltage VT1 of the tunable elements AE1-AE8 at the first temperature TEMP1 and the threshold voltage VT2 of the tunable elements AE1-AE8 at the second temperature TEMP2. The first temperature TEMP1 is different from the second temperature TEMP2. Therefore, the threshold voltages VT1 and VT2 stored by the control element 110 are different from each other.

It may be deduced from the above that the control element 110 obtains the ambient temperature AT according to the temperature signal ST and adjusts the desired common voltage according to the ambient temperature AT, so as to generate different desired common voltages VCOM1 suitable for different temperatures.

In this embodiment, when the ambient temperature AT is the first temperature TEMP1, the control element 110 determines the desired common voltage VCOM1 (VCOM1a) according to at least one of the first output voltage VO1 and the second output voltage VO2 received at the first temperature and according to the threshold voltage VT1.

In addition, when the ambient temperature AT is the second temperature TEMP2, the control element 110 determines the desired common voltage VCOM1 (VCOM1b) according to the at least one of the first output voltage VO1 and the second output voltage VO2 received at the second temperature and according to the threshold voltage VT2. The desired common voltages VCOM1a and VCOM1b may be the same or different.

In some embodiments, the electronic device may not need to be equipped with the temperature detector. The control element 110 may perform a testing step (e.g., step S130 in FIG. 4) at the first temperature TEMP1 to determine the desired common voltage VCOM1. After determining the desired common voltage VCOM1, the control element 110 may perform an operating step at the second temperature TEMP2. The first temperature TEMP1 is higher than the second temperature TEMP2. That is, the control element may be tested at a higher temperature, and the desired common voltage VCOM1 determined at the higher temperature is applied to perform the normal operation at a lower temperature. As such, the control element is required to store the threshold voltage VT1 at one temperature (the first temperature TEMP1) and does not need to store the threshold voltages at other temperatures (such as the threshold voltage VT2 in FIG. 6). As shown in FIG. 6, the voltage difference range R4 at the first temperature TEMP1 corresponds to the curve CR at the second temperature TEMP2, and a variation range of the capacitance values is relatively large. Therefore, in other words, the driving voltage difference range R4 is adapted to the operating step performed at the second temperature TEMP2. In other words, the desired common voltage VCOM1 determined at the first temperature TEMP1 is still applicable to the operating step performed at the second temperature TEMP2.

Figure 7:
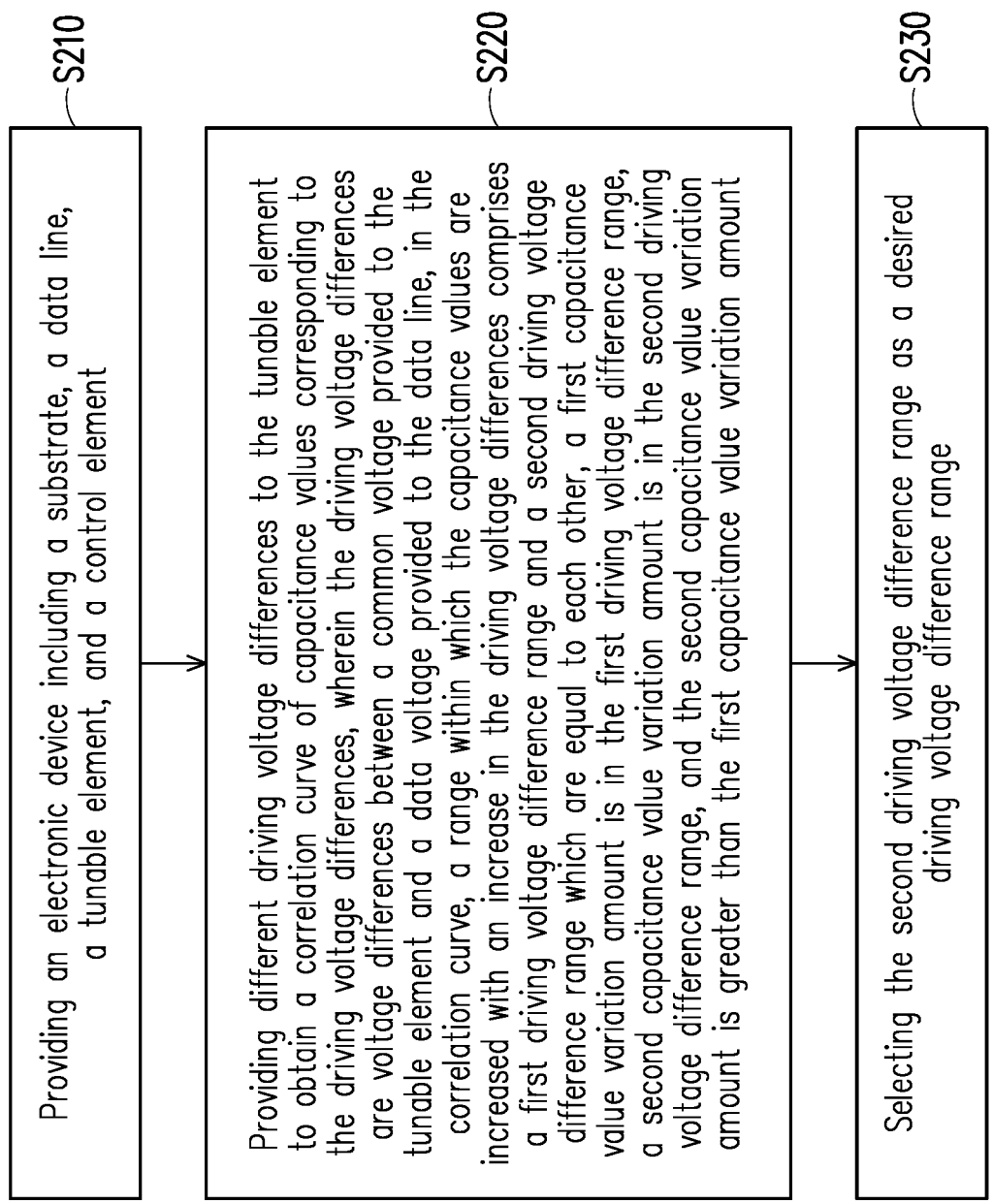
FIG. 7 is a flowchart of a setting method according to the second embodiment of the disclosure.

Please refer to FIG. 1, FIG. 2, and FIG. 7 at the same time. FIG. 7 is a flowchart of a setting method according to the second embodiment of the disclosure. In this embodiment, the setting method is configured to determine a driving voltage difference range of the electronic device 100. In step S210, the electronic device 100 is provided. The electronic device 100 includes the substrate SB, the data lines DL1-DL4, the control element 110, and the tunable elements AE1-AE8. Implementation details of step S210 have been clearly explained in step S110 provided in the embodiments shown in FIG. 1 and FIG. 4 and thus will not be further described hereinafter. In step S220, as shown in FIG. 2, different driving voltage differences are provided to the tunable elements AE1-AE8, and a correlation curve (i.e., the curve C1) illustrating correlations between the driving voltage difference (i.e., voltage difference ΔV) and the corresponding capacitance value is obtained. In this embodiment, the driving voltage difference is the voltage difference between the common voltage provided to the tunable elements AE1-AE8 and the data voltage VD provided to the data lines. As shown in FIG. 2, in the correlation curve C1, the first driving voltage difference range R1 and the second driving voltage difference range R2 which are equal may be included in a range during which the capacitance value increases together with the increase in the driving voltage difference. In the first driving voltage difference range R1, the tunable range of the capacitance value is CR1 (i.e., a first capacitance value variation amount). In the second driving voltage difference range R2, the tunable range of the capacitance value is CR2 (i.e., a second capacitance value variation amount).

In step S230, since the tunable range CR2 is greater than the tunable range CR1, the setting method selects the tunable range CR2 as the desired driving voltage difference range. In this embodiment, the driving voltage difference range R2 include a forward bias range. The maximum value in the driving voltage difference range R2 is the threshold voltage VT of the tunable element AE1. The threshold voltage VT of the tunable element AE1 is the driving voltage difference corresponding to the maximum capacitance value in the curve C1.

In this embodiment, the control element 110 selects the maximum voltage from the desired driving voltage difference range (i.e., the driving voltage difference range R2) and stores the maximum voltage in the control element. In this embodiment, the maximum voltage is equal to the threshold voltage VT of the tunable elements AE1-AE8. That is, the control element 110 stores the threshold voltage VT of the tunable elements AE1-AE8. In this embodiment, the control element 110 provides the first input voltage VI1 to the data lines DL1-DL4, so as to detect and receive the output first output voltage VO1. In step S132, the control element 110 provides the second input voltage VI2 to the data lines DL1-DL4, so as to detect and receive the output second output voltage VO2. In this embodiment, the first input voltage VI1 is less than the second input voltage VI2.

To sum up, according to one or more embodiments of the disclosure, the control element is able to determine the desired common voltage according to the first and second output voltages output by the data line and according to the threshold voltage of the tunable element. Since the first and second output voltages are associated with the result of the actual electric properties, the desired common voltage determined herein may be changed in response to variations in the manufacturing process and/or the design. As such, the driving voltage difference range can be controlled within a desired range, so as to allow the tunable element to have a relatively large frequency variation range. Besides, according to some embodiments, based on different ambient temperatures, the desired common voltage may be determined according to the shift of the threshold voltage. Thereby, the electronic device at different ambient temperatures may still provide a relative large frequency variation range.

Although the embodiments of the disclosure and the advantages thereof have been disclosed above, it should be understood that any person skilled in the art can make changes, substitutions, and modifications without departing from the spirit and scope of the disclosure, and the features of the embodiments can be arbitrarily mixed and replaced to form other new embodiments. In addition, the protection scope of the disclosure is not limited to the process, machine, manufacture, material composition, device, method, and steps in the specific embodiments described in the specification. Any person skilled in the art can understand conventional or future-developed processes, machines, manufactures, material compositions, devices, methods, and steps from the content of the disclosure as long as the same can implement substantially the same functions or achieve substantially the same results in the embodiments described herein. Therefore, the protection scope of the disclosure includes the above processes, machines, manufactures, material compositions, devices, methods, and steps. In addition, each claim constitutes a separate embodiment, and the protection scope of the disclosure further includes combinations of the claims and the embodiments. The protection scope of the disclosure should be defined by the appended claims.

What is claimed is:

1. An electronic device, comprising:
   a substrate;
   a data line, disposed on the substrate;
   a varactor diode, disposed on the substrate;
   a first circuit element, wherein a first terminal of the first circuit element is electrically connected to a test pad, and a second terminal of the first circuit element is electrically connected to the data line;
   a second circuit element, wherein a first terminal of the second circuit element is electrically connected to the varactor diode, and a second terminal of the second circuit element is electrically connected to the data line; and
   a control element, electrically connected to the data line and configured to store a threshold voltage of the varactor diode, wherein the threshold voltage is a driving voltage difference corresponding to a maximum capacitance value;
   wherein the control element is configured to provide a first input voltage to the data line and receive a first output voltage from the test pad, the control element is configured to provide a second input voltage to the data line and receive a second output voltage from the test pad, and the first input voltage is less than the second input voltage,
   wherein the control element is configured to determine a desired common voltage according to at least one of the first output voltage and the second output voltage and according to the threshold voltage of the varactor diode.

2. The electronic device according to claim 1, wherein the first input voltage corresponds to a minimum driving voltage of the electronic device, and the second input voltage corresponds to a maximum driving voltage of the electronic device.

3. The electronic device according to claim 1, wherein the varactor diode has a positive electrode and a negative electrode, the negative electrode is connected to the data line, and the positive electrode is connected to the desired common voltage,
   wherein the desired common voltage is equal to a sum of the threshold voltage and the first output voltage.

4. The electronic device according to claim 1, wherein the varactor diode has a positive electrode and a negative electrode, the positive electrode is connected to the data line, and the negative electrode is connected to the desired common voltage,
   wherein the desired common voltage is equal to the second output voltage subtracting the threshold voltage.

5. The electronic device according to claim 1, further comprising:
   a temperature detector, configured to detect an ambient temperature,
   wherein the threshold voltage stored by the control element comprises: a first threshold voltage of the varactor diode at a first temperature and a second threshold voltage of the varactor diode at a second temperature, and the first temperature is different from the second temperature,
   wherein when the ambient temperature is the first temperature, the control element is configured to determine the desired common voltage according to at least one of the first output voltage and the second output voltage received at the first temperature and according to the first threshold voltage of the varactor diode, and wherein when the ambient temperature is the second temperature, the control element is configured to determine the desired common voltage according to at least one of the first output voltage and the second output voltage received at the second temperature and according to the second threshold voltage of the varactor diode.

6. A setting method for determining a desired common voltage of an electronic device, wherein the setting method comprises following steps:

providing an electronic device, wherein the electronic device comprises a substrate, a data line, a varactor diode, a first circuit element, a second circuit element and a control element, the data line and the varactor diode are disposed on the substrate, and the varactor diode and the control element are electrically connected to the data line, respectively, wherein a first terminal of the first circuit element is electrically connected to a test pad, a second terminal of the first circuit element is electrically connected to the data line, a first terminal of the second circuit element is electrically connected to the varactor diode, a second terminal of the second circuit element is electrically connected to the data line;

storing a threshold voltage of the varactor diode in the control element, wherein the threshold voltage is a driving voltage difference corresponding to a maximum capacitance value; and performing a testing step, the testing step comprising:
providing a first input voltage to the data line and receiving a first output voltage from the test pad;
providing a second input voltage to the data line and receiving a second output voltage from the test pad, wherein the first input voltage is less than the second input voltage; and
determining the desired common voltage according to at least one of the first output voltage and the second output voltage and according to the threshold voltage of the varactor diode.

7. The setting method according to claim 6, wherein the first input voltage corresponds to a minimum driving voltage of the electronic device, and the second input voltage corresponds to a maximum driving voltage of the electronic device.

8. The setting method according to claim 6, wherein
the varactor diode has a positive electrode and a negative electrode, the negative electrode is connected to the data line, and the positive electrode is connected to the desired common voltage,
and the testing step comprises: adding the first output voltage to the threshold voltage of the varactor diode to obtain the desired common voltage.

9. The setting method according to claim 6, wherein
the varactor diode has a positive electrode and a negative electrode, the positive electrode is connected to the data line, and the negative electrode is connected to the desired common voltage,
and the testing step comprises: subtracting the threshold voltage of the varactor diode from the second output voltage to obtain the desired common voltage.

10. The setting method according to claim 6, further comprising an operating step, wherein the operating step comprises:
providing the desired common voltage to the varactor diode by the control element; and
providing a data voltage to the data line by the control element, wherein the data voltage is in a range between the first output voltage and the second output voltage.

11. The setting method according to claim 10, wherein the step of storing the threshold voltage of the varactor diode in the control element further comprises:
storing a first threshold voltage of the varactor diode at a first temperature,
performing the testing step at the first temperature to determine the desired common voltage.

12. The setting method according to claim 11, wherein the operating step is performed at a second temperature, and the first temperature is greater than the second temperature.

13. The setting method according to claim 10, wherein a driving voltage difference range between the desired common voltage and the data voltage comprises a forward bias range.

14. A setting method for determining a driving voltage difference range of an electronic device, wherein the setting method comprises following steps:
providing an electronic device, wherein the electronic device comprises a substrate, a data line, and a varactor diode, wherein the data line and the varactor diode are disposed on the substrate, and the varactor diode is electrically connected to the data line;
providing different driving voltage differences to the varactor diode to obtain a correlation curve of capacitance values corresponding to the driving voltage differences, wherein the driving voltage differences are voltage differences between a common voltage provided to the varactor diode and a data voltage provided to the data line, in the correlation curve, a range within which the capacitance values are increased with an increase in the driving voltage differences comprises a first driving voltage difference range and a second driving voltage difference range which are equal to each other, a first capacitance value variation amount is in the first driving voltage difference range, a second capacitance value variation amount is in the second driving voltage difference range, and the second capacitance value variation amount is greater than the first capacitance value variation amount; and
selecting the second driving voltage difference range as a desired driving voltage difference range.

15. The setting method according to claim 14, wherein the second driving voltage difference range comprises a forward bias range.

16. The setting method according to claim 14, wherein a maximum value in the second driving voltage difference range is the threshold voltage of the varactor diode, and the threshold voltage is the driving voltage difference corresponding to a maximum capacitance value in the correlation curve.

17. The setting method according to claim 14, wherein
the electronic device further comprises a first circuit element and a second circuit element,
the step of providing the electronic device further comprises:
disposing a test pad on the substrate and electrically connecting the test pad to the data line, wherein a first terminal of the first circuit element is electrically connected to the test pad, and a second terminal of the first circuit element is electrically connected to the data line, wherein a first terminal of the second circuit element is electrically connected to the varactor diode, and a second terminal of the second circuit element is electrically connected to the data line;
selecting a maximum voltage in the desired driving voltage difference range:
storing the maximum voltage in the control element;

performing a testing step, wherein the testing step comprises:
providing a first input voltage to the data line and detecting a first output voltage output by the test pad;
providing a second input voltage to the data line and detecting a second output voltage output by the test pad, wherein the first input voltage is less than the second input voltage; and
determining a desired common voltage according to at least one of the first output voltage and the second output voltage and according to the maximum voltage.

18. The setting method according to claim 17, wherein the maximum voltage in the desired driving voltage difference range is the threshold voltage of the varactor diode, and the threshold voltage is the driving voltage difference corresponding to a maximum capacitance value.

19. The setting method according to claim 17, wherein the first input voltage corresponds to a minimum driving voltage of the electronic device, and the second input voltage corresponds to a maximum driving voltage of the electronic device.

* * * * *